US006551757B1

(12) United States Patent
Bailey et al.

(10) Patent No.: US 6,551,757 B1
(45) Date of Patent: Apr. 22, 2003

(54) NEGATIVE-WORKING THERMAL IMAGING MEMBER AND METHODS OF IMAGING AND PRINTING

(75) Inventors: David B. Bailey, Webster, NY (US); Charles W. Lander, Wayland, NY (US)

(73) Assignee: Eastman Kodak Company, Rochester, NY (US)

( * ) Notice: Subject to any disclaimer, the term of this patent is extended or adjusted under 35 U.S.C. 154(b) by 141 days.

(21) Appl. No.: 09/864,570

(22) Filed: May 24, 2001

(51) Int. Cl.[7] .......................................... G03F 7/038

(52) U.S. Cl. ............................... 430/270.1; 430/281.1; 430/286.1; 430/287.1; 430/302; 430/348; 430/434; 430/944; 430/945; 430/964

(58) Field of Search .......................... 430/270.1, 278.1, 430/281.1, 286.1, 287.1, 302, 348, 434, 944, 945, 964; 101/453, 454, 456, 463.1, 465, 466, 467

(56) References Cited

U.S. PATENT DOCUMENTS

| | | | | | |
|---|---|---|---|---|---|
| 3,642,475 | A | | 2/1972 | Vrancken et al. | 96/35 |
| 3,793,025 | A | | 2/1974 | Vrancken et al. | 96/36 |
| 4,604,344 | A | | 8/1986 | Irving et al. | 430/325 |
| 4,634,644 | A | | 1/1987 | Irving et al. | 430/18 |
| 5,605,780 | A | * | 2/1997 | Burberry et al. | 430/278.1 |
| 5,691,114 | A | | 11/1997 | Burberry et al. | 430/302 |
| 5,698,366 | A | | 12/1997 | Tutt et al. | 430/258 |
| 5,759,741 | A | * | 6/1998 | Pearce et al. | 430/271.1 |
| 5,816,162 | A | | 10/1998 | Vermeersch | 101/467 |
| 5,948,591 | A | | 9/1999 | Vermeersch | 430/270.1 |
| 5,948,599 | A | | 9/1999 | Gardner et al. | 430/330 |
| 5,952,136 | A | | 9/1999 | Daems et al. | 430/22 |
| 5,981,144 | A | | 11/1999 | Damme et al. | 430/271.1 |
| 5,981,151 | A | | 11/1999 | Leenders et al. | 430/353 |
| 5,998,088 | A | * | 12/1999 | Robello et al. | 430/269 |
| 6,001,536 | A | | 12/1999 | Vermeersch et al. | 430/302 |
| 6,010,817 | A | | 1/2000 | Van Damme et al. | 430/200 |
| 6,022,667 | A | | 2/2000 | Vermeersch et al. | 430/271.1 |
| 6,030,750 | A | | 2/2000 | Vermeersch et al. | 430/302 |
| 6,232,266 | B1 | * | 5/2002 | Masuda et al. | 503/200 |
| 6,458,507 | B1 | * | 10/2002 | Burberry et al. | 430/270.1 |

FOREIGN PATENT DOCUMENTS

| | | | | | |
|---|---|---|---|---|---|
| EP | 0 514 145 | A1 | | 11/1992 | B41M/5/36 |
| EP | 0 770 495 | A1 | | 5/1997 | B41M/5/36 |
| EP | 0 773 113 | A1 | | 5/1997 | B41M/5/36 |
| EP | 795 420 | A1 | * | 9/1997 | B41M/5/24 |
| EP | 0 816 070 | A1 | | 1/1998 | B41C/1/10 |
| EP | 0 839 647 | A1 | | 5/1998 | B41C/1/10 |
| EP | 0 846 571 | A1 | | 6/1998 | B41M/5/36 |
| EP | 0 849 090 | A2 | | 6/1998 | B41M/5/36 |
| EP | 0 849 091 | A1 | | 6/1998 | B41M/5/36 |
| EP | 0 931 647 | A1 | | 7/1999 | B41C/1/10 |
| EP | 0 932 080 | A1 | | 7/1999 | G03F/1/00 |
| EP | 0 936 081 | A1 | | 8/1999 | B41N/1/00 |
| EP | 0 974 455 | A1 | | 1/2000 | B41C/1/10 |
| EP | 0 976 549 | A1 | | 2/2000 | B41C/1/10 |
| EP | 1 092 595 | A1 | | 4/2001 | B60R/13/10 |
| EP | 0 773 112 | B1 | | 5/2001 | B41M/5/36 |

OTHER PUBLICATIONS 11-268265—Japan Abstract.
9286172—Japan Abstract.
WO 9910186—Abstract.

* cited by examiner

*Primary Examiner*—Janet Baxter
*Assistant Examiner*—Barbara Gilliam
(74) *Attorney, Agent, or Firm*—J. Lanny Tucker

(57) ABSTRACT

A negative-working imaging member can be used as a lithographic printing plate without ablation. The imaging member comprises a support and an imaging layer that includes a dispersion of at least 0.05 g/$m^2$ of a cyanoacrylate polymer that is thermally degradable below 200° C., a photothermal conversion material that is present in an amount to provide a dry weight ratio to the cyanoacrylate polymer of from about 0.02:1 to about 0.8:1, and a hydrophilic binder to provide a dry weight ratio of a hydrophilic binder to the cyanoacrylate polymer of up to 1:1. Thermal imaging energy causes the exposed areas of the imaging layer to adhere to the support while unexposed areas can be readily washed off and/or simultaneously inked for press runs.

23 Claims, No Drawings

NEGATIVE-WORKING THERMAL IMAGING MEMBER AND METHODS OF IMAGING AND PRINTING

FIELD OF THE INVENTION

This invention relates in general to negative-working thermal imaging members (particularly lithographic printing plates). The invention also relates to a method of imaging such imaging members, and to a method of printing.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and ink is applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure to a patterned light image, and perhaps post-exposure heating, either imaged or non-imaged areas are removed using wet processing chemistries.

"Direct-write" imaging avoids the need for patterned light imaging and chemical processing. Direct-write using an infrared radiation laser is a thermally driven process and is more desirable because the laser heats only a small region at a time. Moreover, computer control allows for high-resolution images to be generated at high speed since the images can be produced directly on the imaging member surface, pixel by pixel. The conventional chemical processing steps may also be eliminated in such imaging techniques.

Examples of thermally sensitive printing plates are described in U.S. Pat. No. 5,372,915 (Haley et al.). They include an imaging layer comprising a mixture of dissolvable polymers and an infrared radiation absorbing compound. While these plates can be imaged using lasers and digital information, they still require wet processing using alkaline developer solutions.

It has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}$YAG laser. The absorbing layer converted the infrared energy to heat thus partially loosening, vaporizing or ablating the absorber layer and the overlying silicone rubber. Similar plates are described in Research Disclosure 19201, 1980 as having vacuum-evaporated metal layers to absorb laser radiation in order to facilitate the removal of a silicone rubber overcoated layer. These plates were developed by wetting with hexane and rubbing. Other publications describing ablatable printing plates include U.S. Pat. No. 5,385,092 (Lewis et al.), U.S. Pat. No. 5,339,737 (Lewis et al.), U.S. Pat. No. 5,353,705 (Lewis et al.), U.S. Pat. No. Reissue 35,512 (Nowak et al.), and U.S. Pat. No. 5,378,580 (Leenders).

The noted printing plates have a number of disadvantages. The process of ablation creates debris and vaporized materials that must be collected. The laser power required for ablation can be considerably high, and the components of such printing plates may be expensive, difficult to coat, or unacceptable for resulting printing quality. Such plates generally require at least two coated layers on a support.

Thermal or laser mass transfer is another method of preparing processless lithographic printing plates. Such methods are described for example in U.S. Pat. No. 5,460,918 (Ali et al.) wherein a hydrophobic image is transferred from a donor sheet to a microporous hydrophilic crosslinked silicated surface of the receiver sheet. U.S. Pat. No. 3,964,389 (Peterson) describes a process of laser transfer of an image from a donor material to a receiver material requiring a high temperature post-heating step.

Still another method of imaging is the use of materials comprising microencapsulated hydrophobic materials as described for example in U.S. Pat. No. 5,569,573 (Takahashi et al.). Upon thermal imaging, the microcapsules rupture in an imagewise fashion to provide an ink-receptive image.

Thermally switchable polymers have been described for use as imaging materials in printing plates. By "switchable" is meant that the polymer is rendered from hydrophobic to relatively more hydrophilic or, conversely from hydrophilic to relatively more hydrophobic, upon exposure to heat. U.S. Pat. No. 4,034,183 (Uhlig) describes the use of high powered lasers to convert hydrophilic surface layers to hydrophobic surfaces. A similar process is described for converting polyamic acids into polyimides through a transparency mask in U.S. Pat. No. 4,081,572 (Pacansky). The use of high-powered lasers is undesirable in the industry because of their high electrical power requirements and because of their need for cooling and frequent maintenance.

U.S. Pat. No. 4,634,659 (Esumi et al.) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate's use is in a positive-working mode only.

U.S. Pat. No. 4,405,705 (Etoh et al.) and U.S. Pat. No. 4,548,893 (Lee et al.) describe amine-containing polymers for photosensitive materials used in non-thermal processes. Thermal processes using polyamic acids and vinyl polymers with pendant quaternary ammonium groups are described in U.S. Pat. No. 4,693,958 (Schwartz et al.). U.S. Pat. No. 5,512,418 (Ma) describes the use of polymers having cationic quaternary ammonium groups that are heat-sensitive.

WO 92/09934 (Vogel et al.) describes photosensitive compositions containing a photoacid generator and a polymer with acid labile tetrahydropyranyl or activated ester groups. However, imaging of these compositions converts the imaged areas from hydrophobic to hydrophilic in nature.

EP-A 0 652 483 (Ellis et al.) describes direct-write lithographic printing plates imageable using IR lasers that do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups.

Additional imaging materials described in, for example, U.S. Pat. No. 6,030,750 (Vermeersch et al.) utilize thermoplastic polymer particles that are believed to be capable of coalescing under the influence of heat.

U.S. Pat. No. 5,605,780 (Burberry et al.) describes printing plates that are imaged by an ablation method whereby exposed areas are removed from the heat generated by a focused high-intensity laser beam. The imaging layer is composed of an IR-absorbing compound in a film-forming cyanoacrylate polymer binder. In order for thermal ablation to be successful in such printing plates, the imaging later thickness is generally less than 0.1 $\mu$m and the weight ratio of IR-absorbing compound to the cyanoacrylate polymer is at least 1:1. Thus, the imaging layers are quite thin and have a significant amount of IR-absorbing compound.

There is a need in the graphic arts industry for a means to provide processless, direct-write, negative-working lithographic imaging members that can be imaged without ablation, or the other problems noted above, to provide high sensitivity, high imaging speed, long shelf life, and long press life.

SUMMARY OF THE INVENTION

The problems noted above are overcome with a negative-working imaging member comprising a support having thereon a hydrophilic imaging layer comprising a dispersion of at least 0.05 g/m$^2$ of a cyanoacrylate polymer that is thermally degradable below 200° C., a photothermal conversion material that is present in an amount to provide a dry weight ratio to the cyanoacrylate polymer of from about 0.02:1 to about 0.8:1, and a hydrophilic binder to provide a dry weight ratio of hydrophilic binder to the cyanoacrylate polymer of up to 1:1.

This invention also includes a method of imaging comprising the steps of:

A) providing the imaging member as described above, and

B) imagewise exposing the imaging member to thermal energy to provide exposed and unexposed areas in the hydrophilic imaging layer of the imaging member, whereby the exposed areas are adhered to the support, and C) washing off the unexposed areas to form a negative image in the imaging layer.

A method of printing comprises the steps of carrying out steps A, B, and C noted above, and additionally:

D) simultaneously with or subsequently to, contacting the imagewise exposed imaging member with a lithographic printing ink, and imagewise transferring that printing ink from the imaging member to a receiving material.

Still further, this invention comprises a method of imaging that comprises the steps of:

A) spray coating a dispersion comprising at least 0.05 g/m$^2$ of a cyanoacrylate polymer that is thermally degradable below 200° C., a photothermal conversion material that is present in an amount to provide a dry weight ratio to the cyanoacrylate polymer of from about 0.02:1 to about 0.8:1, and a hydrophilic binder to provide a dry weight ratio of the hydrophilic binder to the cyanoacrylate polymer of up to 1:1, onto a support to provide a negative-working imaging member, and B) imagewise exposing the imaging member with thermal energy to provide exposed and unexposed areas in the hydrophilic imaging layer of the imaging member, whereby the exposed areas are adhered to the support.

The present invention also provides a method of imaging comprising:

A) providing the imaging member described above on press,

B) imagewise exposing the imaging member with thermal energy to provide exposed and unexposed areas in the hydrophilic imaging layer of the imaging member, whereby the exposed areas are adhered to the support, and C) without alkaline processing, washing off the unexposed areas to form a negative image in the hydrophilic imaging layer.

The negative-working imaging members of this invention have a number of advantages and avoid the problems of known printing plates. Specifically, the problems and concerns associated with ablation imaging (that is, imagewise removal of a surface layer) are avoided because imaging is accomplished in the imaging layer by adhering (preferably, irreversibly) exposed areas of the printing surface and washing off unexposed areas before or during printing. Thus, the imaged (exposed) areas are adhered to the support during and after imaging (that is, no ablation imaging occurs). The resulting printing members formed from the imaging members of this invention are negative working in nature.

The thermally sensitive imaging polymers used in the imaging members of this invention can be readily prepared or purchased from a number of commercial sources. Thus, the imaging members are simple to make.

DETAILED DESCRIPTION OF THE INVENTION

Definitions

"Photothermal conversion materials" are inorganic or organic compounds that absorb radiation from an appropriate energy source (such as a laser) and converts that radiation into heat. More details of such compounds are provided below.

As known in the lithographic printing art, materials that release or repel oil-based inks are referred to as having "oleophobic", "hydrophilic", or "ink-repelling" character, and conversely, materials that accept oil-based inks are referred to an "oleophilic" or "hydrophobic."

"Wet processing" refers to washing off unexposed regions of the imaging layer after imaging using water or a fountain solution. It does not refer to contacting the imaging member with alkaline developers or other chemical processing solutions used in conventional lithographic developing methods.

"Dry weight ratio" refers to a weight ratio in dry form (coated or uncoated).

When referring to the cyanoacrylate polymers as "thermally degradable," we mean that greater than 50% (preferably greater than 90%) of the polymer weight is lost, as measured by thermogravimetric analysis. Thus, it is considered that the cyanoacrylate polymers used in the practice of this invention are not "thermoplastic" materials. Thermoplastic materials are known in the art to be materials that undergo no chemical change when heated to a temperature where "flow" can occur.

The imaging members of this invention comprise a support and one or more layers thereon that include a dried thermally sensitive composition as described herein. The support can be any self-supporting material including polymeric films, glass, ceramics, cellulosic materials (including papers), metals or stiff papers, or a lamination of any of these materials. The thickness of the support can be varied and should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 μm. Another preferred embodiment uses aluminum sheets (grained or ungrained, anodized or unanodized) having a thickness of from about 100 to about 600 μm. The support should resist dimensional change under conditions of use. The aluminum and polyester supports are most preferred for the imaging members of this invention.

The support may also be a cylindrical support that includes imaging or printing cylinders on-press as well as printing sleeves that are fitted over printing cylinders. The use of such supports to provide cylindrical imaging members is described in U.S. Pat. No. 5,713,287 (Gelbart). The thermally sensitive composition (or dispersion) described herein can be coated or sprayed directly onto the cylindrical surface that is an integral part of the printing press.

The backside of the support may be coated with antistatic agents and/or slipping layers or matte layers to improve handling and "feel" of the imaging member.

The imaging members, however, preferably have only one layer on the support, that is a heat-sensitive surface layer that is required for imaging. This layer is prepared from a heat-sensitive composition described herein and includes one or more thermally sensitive cyanoacrylate polymers described below and one or more photothermal conversion materials (both described below) as the only essential components for imaging. Because of the particular thermally sensitive polymers used in the imaging layer, the exposed (imaged) areas of the layer are rendered water-insoluble because they are adhered to the support. The unexposed areas remain relatively hydrophilic in nature and can be washed off using water or a fountain solution.

In an alternative embodiment, the imaging member comprises one or more thermally sensitive polymers as described herein in a surface imaging layer, and one or more photothermal conversion materials in a separate layer directly over or underneath, or in thermal contact with, the imaging layer. The photothermal conversion materials can diffuse into the imaging layer prior to or during imaging.

The cyanoacrylate polymers used in the present invention have many advantageous properties for use in image-forming layers of lithographic printing plates, including relatively low decomposition (typically below 200° C.), good ink affinity, excellent adhesion to the surface of the support (especially anodized aluminum), good resistance to common pressroom chemicals, and high wear resistance.

Useful cyanoacrylate polymers include homopolymers derived from a single cyanoacrylate ethylenically unsaturated polymerizable monomer, copolymers derived from two or more such cyanoacrylate monomers, or copolymers derived from one or more such cyanoacrylate monomers and one or "additional" ethylenically unsaturated polymerizable monomers (that are not cyanoacrylates). Where the polymers include recurring units derived from the "additional" monomers, at least 50 mol % of the recurring units in the polymers are derived from one or more cyanoacrylate monomers. The polymers generally have a molecular weight of at least 5000 g/mole, and preferably of at least 10,000 g/mole.

Useful "additional" monomers that can be copolymerized with one or more cyanoacrylate monomers include, but are not limited to, acrylamides, methacrylamides, acrylates and methacrylates (such as ethyl acrylate, ethyl methacrylate, n-butyl acrylate, methyl methacrylate, t-butyl methacrylate, and n-butyl methacrylate), acrylonitrile and methacrylonitrile, styrene and styrene derivatives, acrylamides and methacrylamides, vinyl ethers, vinyl pyridines, vinyl pyrrolidones, vinyl acetate, vinyl halides (such as vinyl chloride, vinylidene chloride, and vinyl bromide), and dienes (such as ethylene, propylene, 1,3-butadiene, and isobutylene). Acrylates, acrylamides and styrene (and its derivatives) are preferred.

Preferably, the cyanoacrylate polymers used in the present invention are poly(alkyl cyanoacrylates), poly(aryl cyanoacrylates), or poly(alkoxyalkyl cyanoacrylates) wherein an alkyl, aryl or alkoxyalkyl group is present as the ester group. Useful substituted or unsubstituted alkyl groups can have 1 to 12 carbon atoms and be linear or branched groups. Useful substituted or unsubstituted alkoxyalkyl groups can have 2 to 14 carbon atoms and be linear or branched groups. Useful substituted or unsubstituted aryl groups are carbocyclic aromatic groups having 6 to 10 carbon atoms in the aromatic ring. Useful substituents on these groups can include any monovalent chemical moiety that a skilled artisan would understand as not harmful to the desired function of the cyanoacrylate polymer.

Representative cyanoacrylate polymers include the following. Molar ratios are shown where the polymers are derived in part from "additional" ethylenically unsaturated polymerizable monomers.

Poly(methyl 2-cyanoacrylate),

Poly(ethyl 2-cyanoacrylate),

Poly(methyl 2-cyanoacrylate-co-ethyl 2-cyanoacrylate),

Poly(methoxyethyl 2-cyanoacrylate),

Poly(n-butyl 2-cyanoacrylate),

Poly(phenyl 2-cyanoacrylate),

Poly(2-ethylhexyl 2-cyanoacrylate),

Poly(methyl 2-cyanoacrylate-co-methoxyethyl 2-cyanoacrylate-co-ethyl-2-cyanoacrylate), and Poly(methyl 2-cyanoacrylate-co-methyl acrylate)(90:10 mol ratio).

Mixtures of the cyanoacrylate polymers can be used as well, particularly mixtures of two or more of the specific listed polymers.

A preferred polymer used in the practice of this invention is poly(methyl 2-cyanoacrylate-co-ethyl 2-cyanoacrylate) and its use is demonstrated in the examples.

The cyanoacrylate polymers useful in this invention can be readily prepared using known polymerization techniques and commonly available starting materials and reagents. Other details of preparation are provided in U.S. Pat. No. 5,605,780 (noted above).

While its presence is not essential for all embodiments, it is preferred to include one or more hydrophilic binders in the hydrophilic imaging layer (formulation) described herein. Thus, the imaging layer can be free of such binders, but generally they are present to provide a dry weight ratio of binder(s) to the total cyanoacrylate polymers of at least 0.01:1 and preferably at least 0.15:1. The dry weight ratio of such binder(s) to cyanoacrylate polymer(s) can be as high as 1:1, but preferably it is up to 0.75:1. Dry weight ratios greater than 1:1 tend to diminish the effectiveness of the cyanoacrylate polymer(s) as imaging components in the imaging layer. Such binders must be water-soluble or water-dispersible so they can be removed from the support in unexposed areas.

Examples of useful hydrophilic binders include, but are not limited to, poly(vinyl alcohol), poly(vinyl pyrrolidones), poly(ethyleneimine) (PEI), poly(ethyloxazoline), polyacrylamide, gelatin (and its derivatives), polyacrylic acid (and salts thereof), and other similar hydrophilic materials that would be readily apparent to one skilled in the art. Mixtures of hydrophilic binders can also be used. Poly(vinyl alcohol) is the preferred hydrophilic binder material. Commercial sources for such materials are well known to skilled artisans.

The imaging layer of the imaging member can also include minor amounts (less than 20 weight %, based on total dry weight of the layer) of additional binder or polymeric materials that will not adversely affect its imaging or printing characteristics. However, the imaging layer comprises no additional materials that are needed for imaging commonly used in printing plates that are wet processed using alkaline developer solutions.

The imaging and any other layers in the imaging member can also include one or more conventional surfactants for coatability or other properties, dyes or colorants to allow visualization of the written image, or any other addenda commonly used in the lithographic art, as long as the concentrations are low enough so they are inert with respect to imaging or printing properties.

It is essential that the imaging member include one or more photothermal conversion materials. Preferably, they absorb radiation in the infrared and near-infrared regions of the electromagnetic spectrum. The photothermal conversion materials useful in this invention include infrared radiation (IR) dyes, a carbon black (including polymer grafted carbons), IR-sensitive pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. Useful absorbing dyes for near infrared diode laser beams are described, for example, in U.S. Pat. No. 4,973,572 (DeBoer). Particular dyes of interest are "broad band" dyes, that is those that absorb over a wide band of the spectrum. Mixtures of one or more types of these compounds can be used if desired. Carbon blacks and IR dyes are preferred photothermal conversion materials.

Still other useful photothermal conversion materials include multisulfonated IR dyes as described U.S. Pat. No. 6,159,657 (Fleming et al.), the disclosure of which is incorporated herein by reference.

Useful IR dyes are sensitive to radiation in the near-infrared and infrared regions of the electromagnetic spectrum. Thus, they are generally sensitive to radiation at or above 700 nm (preferably from about 800 to about 900 nm, and more preferably from about 800 to about 850 nm).

Examples of useful IR dyes of several classes include, but are not limited to, bis(dichlorobenzene-1,2-thiol)nickel(2:1)tetrabutyl ammonium chloride, tetrachlorophthalocyanine aluminum chloride, and the following compounds:

IR Dye 1

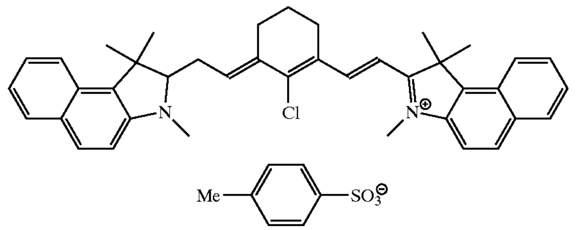

IR Dye 2 is the same as IR Dye 1 but with $C_3F_7CO_2^-$ as the anion.

IR Dye 3

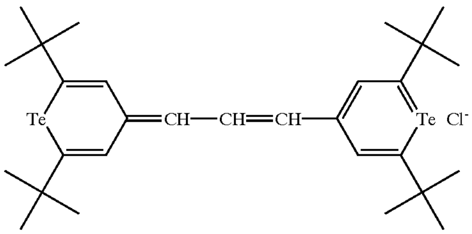

IR Dye 4

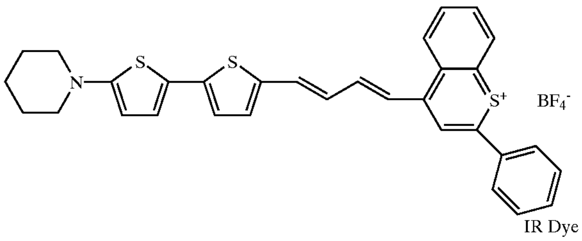

IR Dye 5

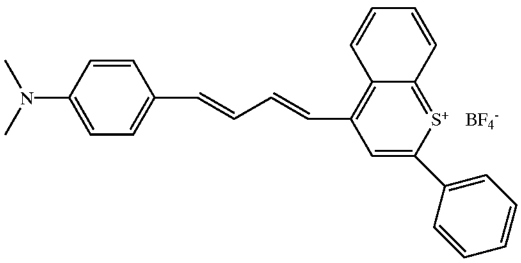

IR Dye 6

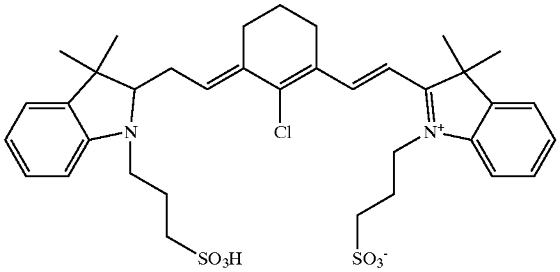

IR Dye 7

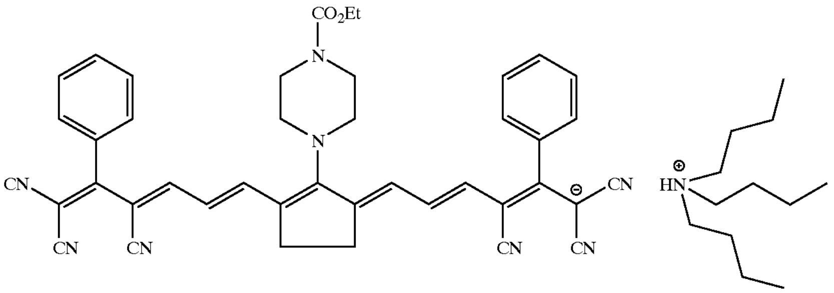

-continued
IR Dye 8
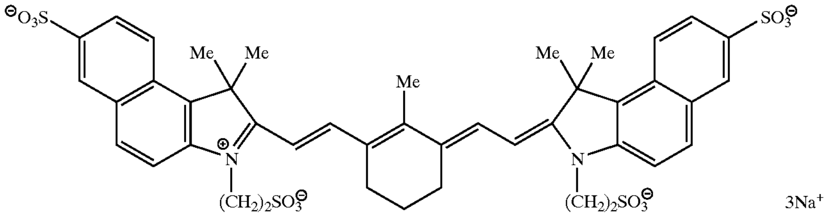
IR Dye 9
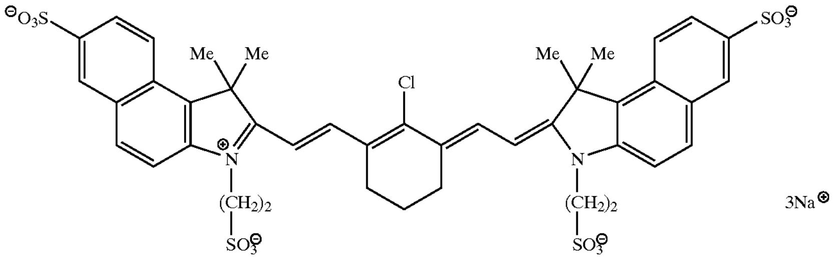
IR Dye 10
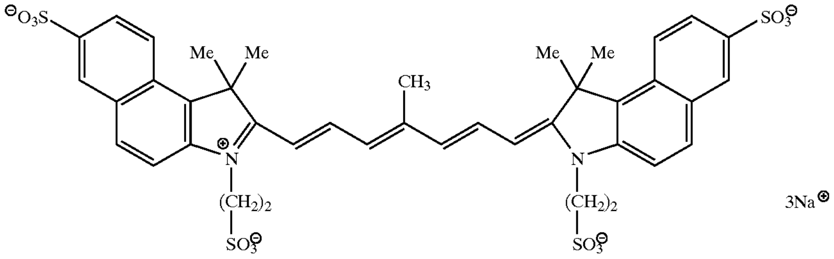
IR Dye 11
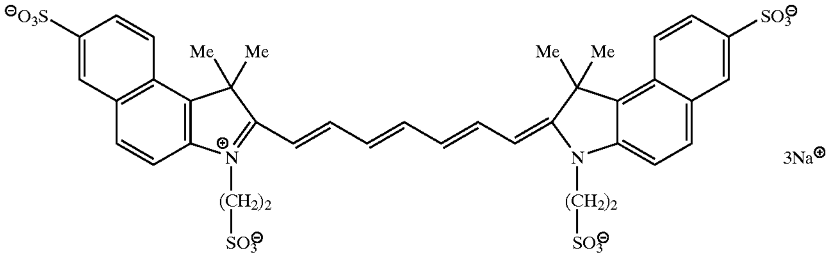
IR Dye 12
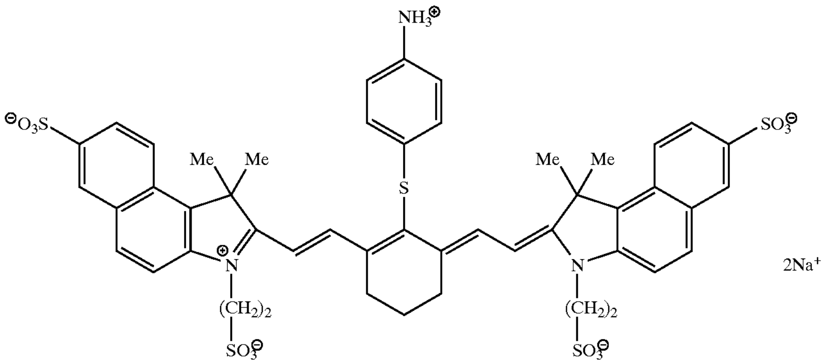

-continued

IR Dye 13

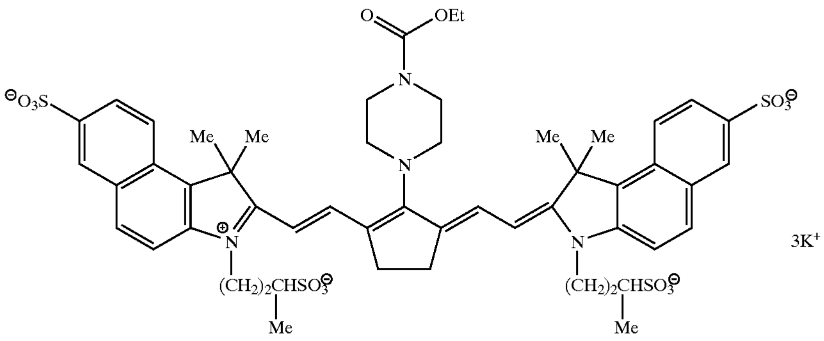

IR Dye 14

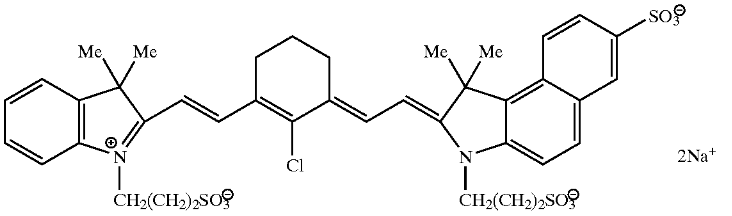

IR Dyes 1–7 can be prepared using known procedures or obtained from several commercial sources (for example, Esprit, Sarasota, Fla.). IR dyes 8–14 can be prepared using known procedures, as described for example in U.S. Pat. No. 4,871,656 (Parton et al.) and reference noted therein (for example, U.S. Pat. Nos. 2,895,955, 3,148,187 and 3,423, 207), all incorporated by reference. Other useful IR dyes are described in U.S. Pat. No. 5,605,780 (noted above), incorporated herein by reference. IR Dye 2 is one particularly useful photothermal conversion material for use in the practice of this invention.

As noted above, the one or more photothermal conversion materials can be formulated in a separate layer that is in thermal contact with the beat-sensitive imaging layer. Thus, during imaging, the action of the additional photothermal conversion material can be transferred to the heat-sensitive imaging layer. Preferably, the one or more photothermal conversion materials are formulated in a dispersion comprising the one or more cyanoacrylate polymers and optional hydrophilic binders.

Wherever the photothermal conversion materials are located, the total amount is generally sufficient to provide an optical density of at least 0.1, and preferably of at least 1.0. The particular amount required for a given material and formulation could be readily determined by a skilled worker in the art using routine experimentation. In the thermally sensitive imaging compositions used to provide hydrophilic imaging layers, the photothermal conversion material(s) is generally present in an amount of from about 5 to about 35% of the total solids (prior to drying). The dry weight ratio of photothermal conversion material to the one or more cyanoacrylate polymers is from about 0.02:1 to about 0.8:1, and preferably from about 0.1:1 to about 0.5:1.

In the typical manufacture of the imaging members of this invention, a thermally sensitive imaging composition is formed by combining the one or more cyanoacrylate polymers, the photothermal conversion material(s), any hydrophilic binder, and any optional addenda in a suitable solvent or mixture of solvents to form a coating solution or dispersion. Various mixing or dispersing techniques may be used that do not adversely affect the performance of the individual composition components.

A layer of the resulting dispersion or composition is then formed on the suitable support and dried in any suitable manner. During coating and drying, solvents, conditions, and equipment are selected to assure suitable adhesion to the support for handling prior to imaging. However, the adhesion is not so strong that the unexposed areas cannot be readily washed off while exposed areas are more strongly adhered to the support.

The thermally sensitive imaging compositions are generally formulated in and coated from water or water-miscible organic solvents including, but not limited to, water-miscible alcohols (for example, methanol, ethanol, isopropanol, 1-methoxy-2-propanol and n-propanol), methyl ethyl ketone, tetrahydrofuran, acetonitrile and acetone. Water, methanol, ethanol and 1-methoxy-2-propanol are preferred. Mixtures (such as a mixture of water and methanol) of these solvents can also be used if desired. By "water-miscible" is meant that the organic solvent is miscible in water at all proportions at room temperature.

In such thermally sensitive imaging compositions (including solvent), the one or more cyanoacrylate polymers are generally present in an amount of at least 1% solids, and preferably at least 2% solids. A practical upper limit of the amount of cyanoacrylate polymer(s) in the composition is 20% solids. The amount of cyanoacrylate polymer(s) present in the dried imaging layer is generally at least 0.05 $g/m^2$, and preferably from about 0.5 to about 2 $g/m^2$ (dry weight). The amounts of photothermal conversion material(s) and any hydrophilic binders can be readily determined from the amount of cyanoacrylate polymer(s).

The dried imaging layer generally has an average dry thickness of from about 0.05 to about 20 $\mu$m, and preferably from about 0.5 to about 4 $\mu$m.

The imaging member of this invention can also include a protective overcoat or surface layer over the hydrophilic imaging layer. Such layers can be composed of one or more hydrophilic binders as described above that are water-soluble or water-dispersible. Preferably, such binders are coatable out of water or one or more water-miscible organic solvents such as ethyl acetate.

The thermally sensitive imaging composition described herein can be applied to a support using any suitable equipment and procedure, such as spin coating, knife coating, gravure coating, dip coating or extrusion hopper coating. In addition, the composition can be sprayed onto a support, including an on-press cylindrical support (such as an on-press cylinder or sleeve), using any suitable spraying means for example as described in U.S. Pat. No. 5,713,287 (noted above) to provide an imaging member.

The negative-working imaging members of this invention can be of any useful form including, but not limited to, printing plates, printing cylinders, printing sleeves and printing tapes (including flexible printing webs), all of any suitable size or dimensions. Preferably, the imaging members are lithographic printing plates having an aluminum support or on-press imaging cylinders having the imaging layer disposed thereon.

To provide an image, the negative-working imaging members of this invention are exposed to a suitable source of energy that generates or provides heat, such as a focused laser beam (for example, from an IR radiation emitting laser) or a thermoresistive head (or "thermal head"), in the foreground areas where ink is desired in the printed image, typically from digital information supplied to the imaging device. A laser used to expose the imaging member of this invention is preferably a diode laser, because of the reliability and low maintenance of diode laser systems, but other lasers such as gas or solid state lasers may also be used.

The combination of power, intensity and exposure time can be readily adjusted by a skilled artisan to adhere the exposed regions of the imaging layer to the support and to avoid significant ablation as described in U.S. Pat. No. 5,605,780 (noted above). Otherwise, the imaging conditions for practicing the methods of this invention are not critical. More importantly to providing the desired imaging effects is the amount of photothermal conversion material used in the imaging members.

Suitable imaging equipment for this type of imaging is well known in the art, including that described in U.S. Pat. No. 5,168,288 (Baek et al.) and U.S. Pat. No. 5,339,737 (Lewis et al.), incorporated herein by reference.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between an imaging device (such as laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the beam can be moved parallel to the drum axis and, after each pass across the imaging member, increment angularly so that the image "grows" circumferentially. In both cases, after a complete scan by the laser beam, an image corresponding to the original document or picture has been formed in the surface of the imaging member.

In the flatbed configuration, a laser beam is drawn across either axis of the imaging member, and is indexed along the other axis after each pass. Obviously, the requisite relative motion can be produced by moving the imaging member rather than the laser beam.

While laser imaging is preferred in the practice of this invention, imaging can be provided by any other means that provides or generates thermal energy in an imagewise fashion. For example, imaging can be accomplished using a thermoresistive head (thermal printing head) in what is known as "thermal printing", described for example in U.S. Pat. No. 5,488,025 (Martin et al.). Such thermal printing heads are commercially available (for example, as Fujitsu Thermal Head FTP-040 MCS001 and TDK Thermal Head F415 HH7-1089).

Imaging on printing press cylinders can be accomplished using any suitable means, for example, as taught in U.S. Pat. No. 5,713,287 (noted above), that is incorporated herein by reference.

After imaging, the imaging member can be used for printing without conventional wet processing with alkaline developers. Unexposed areas in the imaging surface are washed away using water or a conventional fountain solution and exposed areas remain adhered to the support. Ink applied to the imaging member can then be imagewise transferred to a suitable receiving material (such as cloth, paper, metal, glass or plastic) to provide one or more desired impressions. If desired, an intermediate blanket roller can be used to transfer the ink from the imaging member to the receiving material. The imaging members can be cleaned between impressions, if desired, using conventional cleaning means.

The following examples are presented to illustrate the practice of this invention and are not intended to be limiting in any way.

Methods and Materials for Examples

Thermally sensitive coating dispersions were prepared by mixing the indicated amounts of cyanoacrylate polymer(s), infrared sensitive (IR) dye, and water in a sealed metal tube containing 300 g of 1.3 mm-diameter chrome-plated steel balls. The contents were shaken vigorously for 1.5 hours after which the formulations were separated from the chrome-plate steel balls.

After adding other addenda, the coating formulations were coated at a wet coverage of 21.6 ml/m$^2$ onto 5.5 mil (140 $\mu$m) thick anodized, grained aluminum sheet supports to provide the dried layer coverage noted in TABLE II below.

All of the resulting printing plates were dried in a convection oven at 82° C. for 3 minutes, clamped onto the rotating drum of a conventional platesetter having an array of laser diodes operating at a wavelength of 830 nm each focused to a spot diameter of 23 mm at dosages ranging from 500 to 1500 mJ/cm$^2$. Each channel provided a maximum of 450 mWatts (mW) of power incident upon the imaging layer surface. The plates were then soaked for about 15 seconds in Varn Universal Pink fountain solution and gently wiped with a soft cloth under a stream of distilled water.

Each laser-exposed plate was then mounted on the plate cylinder of a conventional full-page A. B. Dick 9870 lithographic duplicator press for actual press runs using VanSon Diamond Black lithographic printing ink to provide a few thousand impressions on paper or until failure.

EXAMPLE 1

A thermally sensitive Dispersion I was prepared for this invention using the following components:

| | |
|---|---|
| Poly(methyl cyanoacrylate-co-ethyl cyanoacrylate)(70:30 weight ratio) "PCA" Polymer | 3.5 g |
| IR Dye 2 | 3.5 g |
| Water | 63 g |

Dispersion II was similarly prepared using 5.6 g of polymer, 61.2 g of water, and no IR dye.

A coating formulation was prepared from these dispersions by mixing 3.6 g of Dispersion I, 4.03 g of Dispersion II, water (5.04 g), a 10% (by weight) solution of poly(vinyl alcohol) (MW 3000, 2.18 g), and a 5% (by weight) solution of FLUORAD FC431 nonionic coating aid (0.15 g, 3M Corp.).

The printing results for the resulting printing plates are shown in TABLE II below.

Comparative Example 1

| | |
|---|---|
| Poly(methyl methacrylate) "Mm" polymer | 3.5 g |
| IR Dye 2 | 3.5 g |
| Water | 63 g |

Dispersion IV was similarly prepared with 5.6 g of polymer, 61.2 g of water, and no IR dye.

A coating formulation was prepared by mixing 3.6 g of Dispersion III and 4.03 g of Dispersion IV, water (5.04 g), a 10% (by weight) solution of poly(vinyl alcohol) (MW 3000, 2.18 g), and a 5% (by weight) solution of FLUORAD FC431 nonionic coating aid (0.15 g, 3M Corp.).

The printing results for the resulting printing plates are shown in TABLE II below.

Comparative Example 2

A 27.5% solids latex of poly(methyl methacrylate) (Latex M) was prepared by mixing methyl methacrylate monomer (30 g), water (78 g), sodium dioctylsulfosuccinate surfactant (75% solution, 0.9 g), and potassium persulfate polymerization catalyst (0.15 g). The mixture was heated at 60° C. for 18 hours to form the desired polymer latex.

Dispersion V was prepared using the following components:

| | |
|---|---|
| Latex M | 12.73 g |
| IR Dye 2 | 3.5 g |
| Water | 53.8 g |

A coating formulation was prepared by mixing Dispersion V (3.6 g), Latex M (1.12 g), water (7.95 g), a 10% (by weight) solution of poly(vinyl alcohol) (MW 3000, 2.18 g), and a 5% (by weight) solution of FLUORAD FC431 nonionic coating aid (0.15 g, 3M Corp.).

The printing results for the resulting printing plates are shown in TABLE II below.

EXAMPLES 2a–2g

A thermally sensitive Dispersion VI was prepared using the following components:

| | |
|---|---|
| Poly(methyl cyanoacrylate-co-ethyl cyanoacrylate)(70:30 weight ratio) "PCA" polymer | 9.8 g |
| IR Dye 2 | 3.5 g |
| Water | 56.7 g |

A series of coating formulations was prepared by mixing Dispersion VI (3.6 g), water (see TABLE I), various amounts of a 10% (by weight) solution of poly(vinyl alcohol) (MW 3000, see TABLE I), and a 5% (by weight) solution of FLUORAD FC431 nonionic coating aid (0.15 g, 3M Corp.).

The printing results for the resulting printing plates are shown in TABLE II below.

Comparative Examples 3a–3g

A 28.7% solids latex of poly(methyl methacrylate-co-acrylic acid) (Latex E) was prepared by mixing methyl methacrylate monomer (29.1 g), methacrylate acid monomer (0.9 g), water (78 g), sodium dioctylsulfosuccinate surfactant (75% solution, 0.9 g), and potassium persulfate catalyst (0.15 g). The mixture was heated at 60° C. for 18 hours to form the desired polymer latex.

Thermally sensitive dispersion VII was prepared using the following components:

| | |
|---|---|
| Latex E | 34.15 g |
| IR Dye 2 | 3.5 g |
| Water | 32.35 g |

A series of coating formulations was prepared by mixing the Dispersion VII (3.6 g), water (see TABLE I), a 10% (by weight) solution of poly(vinyl alcohol) (MW 3000, see TABLE I), and a 5% (by weight) solution of FLUORAD FC431 nonionic coating aid (0.15 g, 3M Corp.).

The printing results for the resulting printing plates are shown in TABLE II below.

Comparative Example 4

Dispersion VIII was prepared using the following components:

| | |
|---|---|
| Latex M | 34.15 g |
| IR Dye 2 | 3.5 g |
| Water | 32.35 g |

A coating formulation was prepared by mixing Dispersion VIII (3.6 g), water (9.09 g), a 10% (by weight) solution of poly(vinyl alcohol) (MW 3000, 2.18 g), and a 5% (by weight) solution of FLUORAD FC431 nonionic coating aid (0.15 g, 3M Corp.).

The printing results for the resulting printing plates are shown in TABLE II below.

TABLE I

| Example | Coating Dispersion | Water (g) | PVA Solution (g) |
|---|---|---|---|
| Example 2a | VI | 4.44 | 6.83 |
| Example 2b | VI | 7.89 | 3.38 |
| Example 2c | VI | 9.09 | 2.18 |
| Example 2d | VI | 9.84 | 1.43 |
| Example 2e | VI | 10.59 | 0.68 |
| Example 2f | VI | 10.92 | 0.34 |
| Example 2g | VI | 11.26 | 0 |
| Comparative Example 3a | VII | 4.44 | 6.83 |
| Comparative Example 3b | VII | 7.89 | 3.38 |
| Comparative Example 3c | VII | 9.09 | 2.18 |
| Comparative Example 3d | VII | 9.84 | 1.43 |
| Comparative Example 3e | VII | 10.59 | 0.68 |
| Comparative Example 3f | VII | 10.92 | 0.34 |
| Comparative Example 3g | VII | 11.26 | 0 |

TABLE II

| | Polymer | Polymer Coverage (mg/m²) | IR Dye Coverage (mg/m²) | PVA Coverage (mg/m²) | Imaging/Printing Results |
|---|---|---|---|---|---|
| Example 1 | PCA | 724 | 259 | 313 | Provided 5000 impressions without failure |
| Comparative Example 1 | Mm | 724 | 259 | 313 | Failed by 500 impressions* |
| Comparative Example 2 | Latex M | 724 | 259 | 313 | Failed by 500 impressions** |
| Example 2a | PCA | 724 | 259 | 983 | No image |
| Example 2b | PCA | 724 | 259 | 486 | Provided 3000 impressions without failure |
| Example 2c | PCA | 724 | 259 | 313 | Provided 3000 impression without failure |
| Example 2d | PCA | 724 | 259 | 205 | Provided 3000 impressions without failure |
| Example 2e | PCA | 724 | 259 | 97 | Provided 4000 impressions without failure |
| Example 2f | PCA | 724 | 259 | 49 | Provided 3000 impressions without failure |
| Example 2g | PCA | 724 | 259 | 0 | Provided 3000 impressions without failure |
| Comparative Example 3a | Latex E | 724 | 259 | 983 | No image |
| Comparative Example 3b | Latex E | 724 | 259 | 486 | Failed by 500 impressions*** |
| Comparative Example 3c | Latex E | 724 | 259 | 313 | Failed by 500 impressions**** |
| Comparative Example 3d | Latex E | 724 | 259 | 205 | Failed by 500 impressions**** |
| Comparative Example 3e | Latex E | 724 | 259 | 97 | Failed by 500 impressions**** |
| Comparative Example 3f | Latex E | 724 | 259 | 49 | Coating formulation not could not be coated |
| Comparative Example 3g | Latex E | 724 | 259 | 0 | Coating formulation not could not be coated |
| Comparative Example 4 | Latex E | 724 | 259 | 313 | Failed by 500 impressions**** |

*Image was completely gone.
**Non-inking of large areas.
***Image was completely gone.
***Large areas of image were gone.

The data in TABLE II for the various Comparative Examples indicate that printing plates having imaging layers containing thermoplastic particles formed from various methacrylates ("Mn", Latex M, and Latex E) failed by at least 500 impressions due to lack of inking in portions of the image (exposed) areas. Moreover, if the amount of hydrophilic binder [for example, poly(vinyl alcohol)] was too high in relation to the cyanoacrylate polymers (Example 2a), the resulting printing plate failed to provide suitable imaging properties. All of the printing plates of the present invention provided several thousand impressions without any loss of resolution or other imaging or printing failure.

EXAMPLE 3

Several additional printing plates of the present invention were prepared similarly to those described in Example 1 above. TABLE III below shows the dry coverage of each of the cyanoacrylate polymer, IR Dye 2, and poly(vinyl alcohol) for each plate including the Control printing plate that contained no IR Dye 2 and did not provide an image.

TABLE III

| Polymer Coverage (mg/m²) | IR Dye Coverage (mg/m²) | PVA Coverage (mg/m²) | Imaging/Printing Results |
|---|---|---|---|
| 724 | 130 | 313 | Provided 3000 impressions without failure |
| 724 | 65 | 313 | Provided 3000 impressions without failure |
| 724 | 130 | 97 | Provided 3000 impressions without failure |
| 724 | 65 | 97 | Provided 3000 impressions without failure |
| 724 | 32.5 | 97 | Provided 8000 impressions without failure |
| 724 | 16.2 | 97 | Provided 8000 impressions without failure |
| 724 | 0 | 97 | Control N: no image |
| 364 | 32.5 | 49 | Provided 4000 impressions without failure |
| 181 | 16.2 | 25 | Provided 4000 impressions without failure |
| 90.7 | 8.6 | 11.9 | Provided 1000 impressions without failure |

It is can be seen from these data that wide ranges of IR dye, cyanoacrylate polymer, and hydrophilic binder can be used in the practice of this invention as long as the dry weight ratio of IR dye to cyanoacrylate polymer is from about 0.02:1 to about 0.8:1, and the dry weight ratio of hydrophilic binder to cyanoacrylate polymer is up to 1:1.

EXAMPLE 4

The use of various hydrophilic binders in the imaging layer was also explored. Thermally sensitive imaging dispersions and printing plates were prepared as described in Example 1 except that the hydrophilic binders listed in the following TABLE IV were used.

TABLE IV

| Polymer Coverage ($mg/m^2$) | IR Dye Coverage ($mg/m^2$) | Binder Coverage ($mg/m^2$) | Binder | Imaging/Printing Results |
|---|---|---|---|---|
| 724 | 130 | 97 | Poly (ethyloxazoline) | Provided 8000 impressions without failure |
| 724 | 130 | 97 | Poly(vinyl alcohol), mol. weight about 100,000 | Provided 8000 impressions without failure |
| 724 | 130 | 97 | Poly(vinyl pyrrolidone) | Provided 8000 impressions without failure |
| 724 | 130 | 97 | Poly (ethyleneimine) | Provided 8000 impressions without failure |

*These materials are commonly available from several commercial sources.

These data indicate that various representative hydrophilic binder materials can be used to advantage in the practice of the present invention.

The invention has been described in detail with particular reference to preferred embodiments thereof, but it will be understood that variations and modifications can be effected within the spirit and scope of the invention.

We claim:

1. A negative-working imaging member comprising a support having thereon a hydrophilic imaging layer comprising a dispersion of at least 0.05 $g/m^2$ of a cyanoacrylate polymer that is thermally degradable below 200° C., a photothermal conversion material that is present in an amount to provide a dry weight ratio to said cyanoacrylate polymer of from about 0.02:1 to about 0.8:1, and a hydrophilic binder to provide a dry weight ratio of said hydrophilic binder to said cyanoacrylate polymer of up to 1:1.

2. The imaging member of claim 1 wherein said hydrophilic imaging layer comprises said hydrophilic binder and said cyanoacrylate polymer to provide a dry weight ratio of from about 0.01:1 to 1:1.

3. The imaging member of claim 2 wherein said hydrophilic imaging layer comprises said hydrophilic binder and said cyanoacrylate polymer to provide a dry weight ratio of from about 0.15:1 to 0.75:1.

4. The imaging member of claim 1 wherein said hydrophilic imaging layer has a dry thickness of from about 0.05 to about 20 μm.

5. The imaging member of claim 4 wherein said hydrophilic imaging layer has a dry thickness of from about 0.5 to about 4 μm.

6. The imaging member of claim 1 wherein the dry weight ratio of said photothermal conversion material to said cyanoacrylate polymer is from about 0.1:1 to about 0.5:1.

7. The imaging member of claim 1 comprising a polyester or aluminum support.

8. The imaging member of claim 1 wherein said support is an on-press printing cylinder.

9. The imaging member of claim 1 wherein said cyanoacrylate polymer is a poly(alkyl cyanoacrylate), poly (aryl cyanoacrylate), or poly(alkoxyalkyl cyanoacrylate) and has a molecular weight of at least 5000 g/mole.

10. The imaging member of claim 1 wherein said cyanoacrylate polymer is:

poly(methyl cyanoacrylate), poly(ethyl cyanoacrylate), poly(methyl cyanoacrylate-co-ethyl cyanoacrylate), poly(methoxyethyl cyanoacrylate), poly(n-butyl cyanoacrylate), poly(phenyl cyanoacrylate), poly(2-ethylhexyl cyanoacrylate), poly(methyl 2-cyanoacrylate-co-methoxyethyl 2-cyanoacrylate-co-ethyl-2-cyanoacrylate), poly(methyl 2-cyanoacrylate-co-methyl acrylate), or a mixture of two or more of these.

11. The imaging member of claim 1 wherein said cyanoacrylate polymer is composed of recurring units derived from one or more cyanoacrylate polymerizable monomers and recurring units derived from one or more additional ethylenically unsaturated polymerizable monomers, the recurring units derived from one or more said cyanoacrylate polymerizable monomers comprising at least 50 mol % of the total recurring units in said cyanoacrylate polymer.

12. The imaging member of claim 1 wherein said hydrophilic polymer is poly(vinyl alcohol), poly(vinyl pyrrolidones), polyethyleneimine, poly(ethyloxazoline), polyacrylamide, gelatin (and its derivatives), polyacrylic acid (and salts thereof), or mixtures thereof.

13. The imaging member of claim 1 wherein said photothermal conversion material is an IR dye, an IR-sensitive pigment, or a carbon black.

14. The imaging member of claim 1 wherein said photothermal conversion material is a carbon black or an IR dye that is bis(dichlorobenzene-1,2-thiol)nickel(2:1)tetrabutyl ammonium chloride, tetrachlorophthalocyanine aluminum chloride, or one of the following compounds:

IR Dye 1

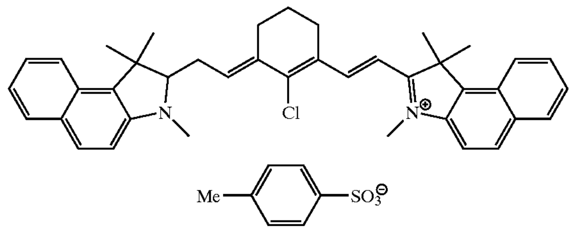

IR Dye 2 is the same as IR Dye 1 but with $C_3F_7CO_2^-$ as the anion.

IR Dye 3
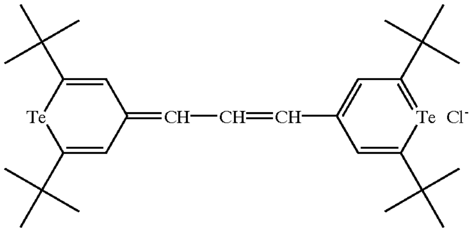
IR Dye 4
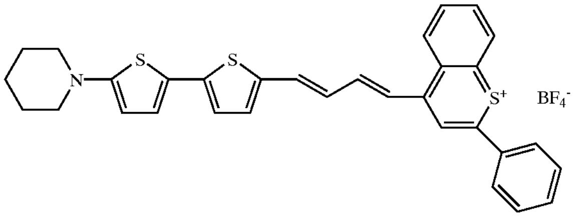
IR Dye 5
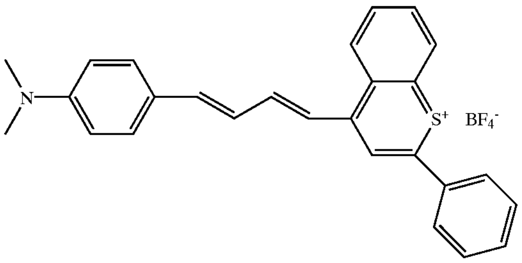
IR Dye 6
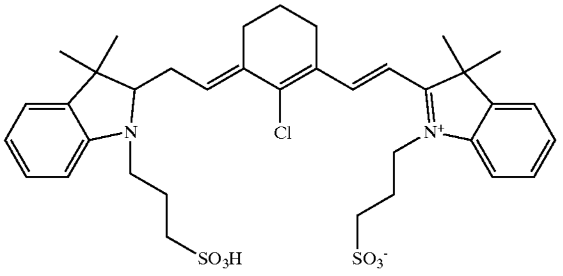
IR Dye 7
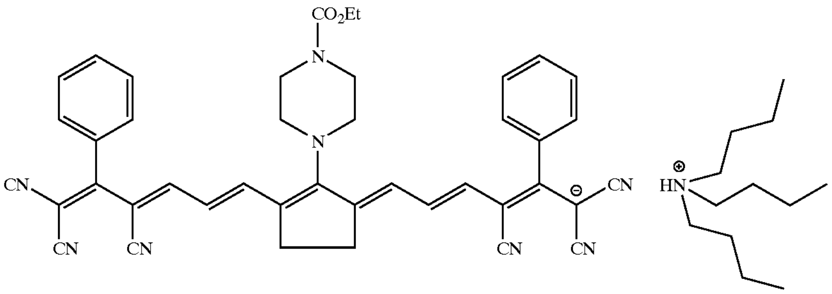
IR Dye 8
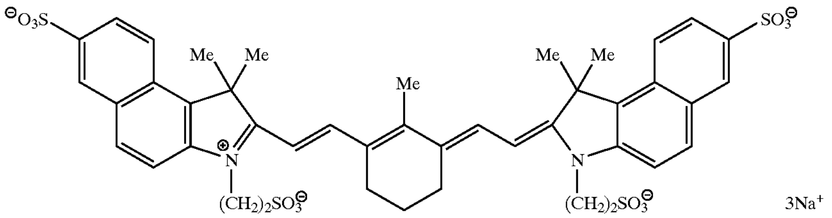
IR Dye 9
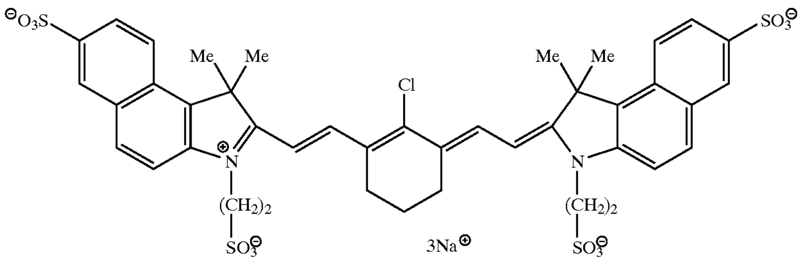
IR Dye 10
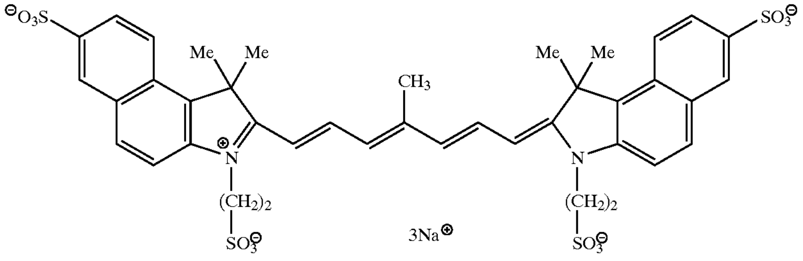

-continued

IR Dye 11

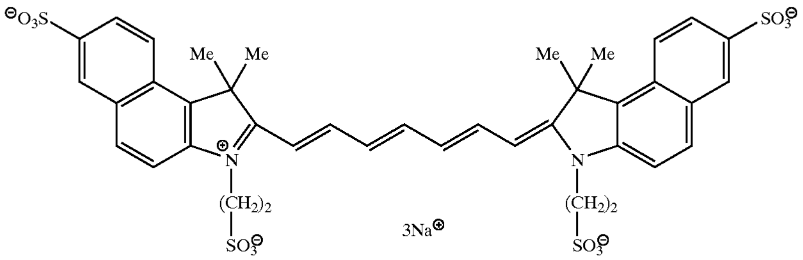

IR Dye 12

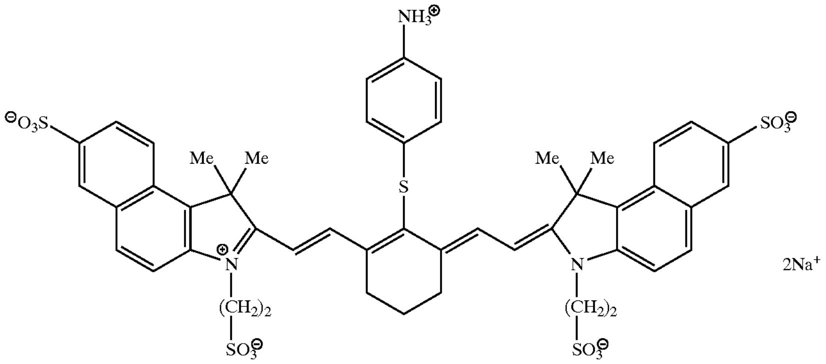

IR Dye 13

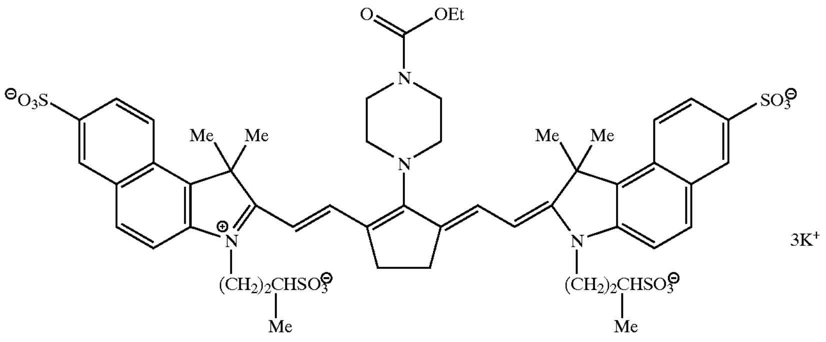

IR Dye 14

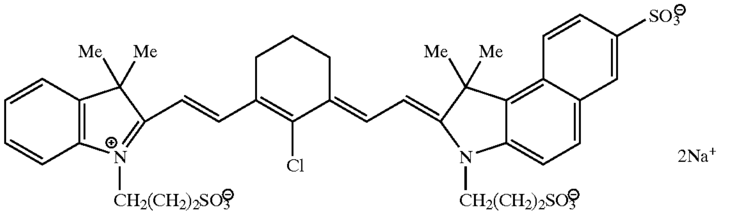

15. A method of imaging comprising:

A) providing the imaging member of claim 1, and

B) imagewise exposing said imaging member with thermal energy to provide exposed and unexposed areas in said hydrophilic imaging layer of said imaging member, whereby said exposed areas are adhered to said support, and C) washing off said unexposed areas to form a negative image in said hydrophilic imaging layer.

16. The method of claim 15 wherein said imagewise exposing is carried out using an IR radiation emitting laser, and said imaging member is a lithographic printing plate having an aluminum support or an on-press imaging cylinder having a cylindrical support.

17. The method of claim 15 wherein said imagewise exposing is accomplished using a thermoresistive head.

18. A method of printing comprising:

A) providing the imaging member of claim 1,

B) imagewise exposing said imaging member with thermal energy to provide exposed and unexposed areas in said hydrophilic imaging layer of said imaging member, whereby said exposed areas are adhered to said support, C) washing off said unexposed areas to form a negative image in said hydrophilic imaging layer, and D) simultaneously with or subsequent to step C, contacting said imagewise exposed imaging member with a lithographic printing ink, and imagewise transferring said printing ink from said imaging member to a receiving material.

19. A method of imaging comprising:

A) providing the imaging member of claim 1 on press,

B) imagewise exposing said imaging member with thermal energy to provide exposed and unexposed areas in said hydrophilic imaging layer of said imaging member, whereby said exposed areas are adhered to said support, and C) without wet processing, washing off said unexposed areas to form a negative image in said hydrophilic imaging layer.

20. A method of imaging comprising:

A) spray coating a dispersion comprising at least 0.05 $g/m^2$ of a cyanoacrylate polymer that is thermally degradable below 200° C., a photothermal conversion material that is present in an amount to provide a dry weight ratio to said cyanoacrylate polymer of from about 0.02:1 to about 0.8:1, and a hydrophilic binder to provide a dry weight ratio of said hydrophilic binder to said cyanoacrylate polymer of up to 1:1, onto a support to provide a negative-working imaging member, and B) imagewise exposing said imaging member with thermal energy to provide exposed and unexposed areas in said hydrophilic imaging layer of said imaging member, whereby said exposed areas are adhered to said support.

21. The method of claim 20 wherein said unexposed areas are washed off said imaging member and said imaging member is inked and used in press runs.

22. The method of claim 20 wherein said imagewise exposing is carried out using an IR radiation emitting laser.

23. The method of claim 20 wherein said support is an on-press printing cylinder.

* * * * *